United States Patent
Kong et al.

(10) Patent No.: US 7,614,025 B1
(45) Date of Patent: Nov. 3, 2009

(54) METHOD OF PLACEMENT FOR ITERATIVE IMPLEMENTATION FLOWS

(75) Inventors: Raymond Kong, San Francisco, CA (US); Sandor S. Kalman, Santa Clara, CA (US)

(73) Assignee: XILINX, Inc., San Jose, CA (US)

( * ) Notice: Subject to any disclaimer, the term of this patent is extended or adjusted under 35 U.S.C. 154(b) by 238 days.

(21) Appl. No.: 11/787,785

(22) Filed: Apr. 18, 2007

(51) Int. Cl.
G06F 17/50 (2006.01)
G06F 9/45 (2006.01)

(52) U.S. Cl. .................. 716/10; 716/1; 716/8; 716/9; 716/11; 716/12; 716/13

(58) Field of Classification Search .............. 716/1–2, 716/7–15
See application file for complete search history.

(56) References Cited

U.S. PATENT DOCUMENTS 5,825,659 A * 10/1998 Nguyen et al. ............... 716/14
7,225,116 B2 * 5/2007 Harn ............................ 703/14
7,306,977 B1 * 12/2007 Verma et al. ................ 438/129

OTHER PUBLICATIONS

Xilinx, Inc.; "Development System Reference Guide"; Chapters 3, 4, 5; Copyright 1995-2005; available from Xilinx, Inc., 2100 Logic Drive, San Jose, California 95124; pp. 55-140.

* cited by examiner

Primary Examiner—Jack Chiang
Assistant Examiner—Nghia M Doan
(74) Attorney, Agent, or Firm—Kevin T. Cuenot; LeRoy D. Maunu; Lois D. Cartier

(57) ABSTRACT

A method of implementing a circuit design in a target device can include identifying routing information for a circuit design that has been at least partially implemented. A plurality of empty sites of the target device within which the circuit design is to be implemented can be identified. The method also can include determining whether each of the plurality of empty sites of the target device has a routing conflict according to the routing information of the circuit design and generating a list specifying each empty site of the target device that has a routing conflict.

16 Claims, 3 Drawing Sheets

300

400

METHOD OF PLACEMENT FOR ITERATIVE IMPLEMENTATION FLOWS

FIELD OF THE INVENTION

The embodiments disclosed herein relate to the field of Electronic Design Automation and, more particularly, to placement of a circuit design in the context of iterative implementation flows.

BACKGROUND

Software-based Electronic Design Automation (EDA) tools, in general, can process circuit designs through what is referred to as an implementation flow to implement the circuit design within a given target programmable logic device (PLD). A circuit design can be specified in programmatic form, e.g., as a netlist, as one or more hardware description language files, or the like. A typical implementation flow entails various phases, or stages, such as synthesis, translation, packing, placement, and routing. The resulting circuit design is transformed into a bitstream that, when loaded into the target PLD, configures the target PLD to implement the circuit design.

Modern EDA tools also support iterative implementation flows. An iterative implementation flow is characterized by more than one pass through one or more or all phases of an implementation flow. Within an iterative implementation flow, the EDA tools must be able to process an existing implementation or a partial implementation of the circuit design. Typically, after a first pass through one or more phases of an implementation flow, the user makes some change to the existing circuit design. Such a change can include, but is not limited to, an HDL change, a timing requirement change, a physical packaging change, a physical floor-planning change, a design attribute change, etc. The circuit design is re-implemented in that it is processed through one or more of the phases of the implementation flow such that the changes are applied to the existing implementation, whether whole or partial, of the circuit design. That is, the changes are applied to a version of the circuit design that was generated from a prior implementation flow or phase of an implementation flow.

Examples of iterative implementation flows can include, but are not limited to, guide exact flow, guide leveraged flow, incremental design flow, and modular design flow. These examples of iterative implementation flows are supported by various software implementation tools available from Xilinx, Inc. of San Jose, Calif. (Xilinx® is a trademark of Xilinx, Inc. in the United States, other countries, or both.) Guide exact flow, for example, attempts to incorporate circuit design changes into the existing circuit design while preserving as much of the previous implementation of the circuit design as possible. Typically, the unchanged portions of the circuit design are "locked" throughout the re-implementation process.

Guide leverage flow refers to a process in which circuit design changes are incorporated into the existing circuit design, but implementation, or re-implementation, runtime is minimized. Runtime minimization usually entails taking the unchanged portions of the circuit design as the starting point and allowing changes to be applied to the circuit design, including the unchanged portions, as needed to implement the specified changes.

Incremental design flow refers to a process that combines objectives of guide exact and guide leverage flows into a single flow. In an incremental flow, the circuit design is divided into smaller pieces referred to as "partitions". For each partition that is not affected by a "current" change, the EDA tool re-applies the previous implementation of that partition. The EDA tool may alter the previous implementation of various partitions to the extent permitted by user assigned attributes associated with each respective partition of the circuit design.

Modular design flow refers to a divide-and-conquer technique in which a circuit design is subdivided, or partitioned, into a plurality of sub-designs. Each sub-design can be implemented independently of the others. This approach is suited for team environments in which different teams of developers are tasked with developing different sub-designs.

In each of these iterative implementation flow examples, the EDA tool must process an implemented, or partially implemented, circuit design into a feasible circuit design, i.e., one that can be successfully implemented on a target PLD. To this extent, other circuit design techniques also can be viewed as iterative implementation flows. For example, the inclusion of hard macros which specify placed and routed components, into a circuit design may be considered a type of iterative implementation flow.

Most PLDs, for example field programmable gate arrays, are constrained with respect to the number, or amount, of circuit resources that can be provided. Such constraints stem from a variety of factors including overall chip area. As a result, there typically is a large number of wires versus the number of available programmable interconnect points (PIPs) on a device. This means that each wire on the PLD cannot connect to each other wire on the PLD. Instead, wiring connectivity is carefully designed to maximize connectivity and circuit performance through the limited number of PIPs that are provided.

Limited routing connectivity associated with PLDs can create a number of circuit design challenges that EDA tools must address in order to generate feasible, routed, circuit designs. For example, limited routing connectivity influences the placement phase of an implementation flow, particularly in the context of iterative implementation flows.

SUMMARY

The present invention relates to placing elements of a circuit design in the context of an iterative implementation flow. One embodiment of the present invention can include a computer-implemented method of implementing a circuit design in a target device. The method can include identifying routing information for a circuit design that has been at least partially implemented and identifying a plurality of empty sites of the target device within which the circuit design is to be implemented. The method further can include determining whether each of the plurality of empty sites of the target device has a routing conflict according to the routing information of the circuit design and generating a list specifying each of the plurality of empty sites of the target device that has a routing conflict. The generated list can be output, for example, by storing the list in a memory, passing the list to subsequent implementation software, providing the list to a user, and so forth.

The method can include generating a placed circuit design such that no circuit element of the circuit design is assigned to an empty site on the list of empty sites. Determining whether each of the plurality of empty sites of the target device has a routing conflict can include determining whether at least one pin of each of the plurality of empty sites has a blockage. The method also can include determining that a pin does not have a blockage if, while traversing a directed acyclic graph (DAG)

representing routing information with respect to the pin, a node having an incoming degree of two or more is not used. A DAG, for example, can nodes that map to wires, arcs that map to programmable interconnection points, and where current flow is represented by the direction of an arc.

In another embodiment, determining whether each of the plurality of empty sites of the target device has a routing conflict can include, for each of the plurality of empty sites, selecting a pin of an empty site, while traversing a DAG representing routing information with respect to the selected pin, determining whether a node having an incoming degree of at least one is used, and, if so, determining whether the node is associated with a routing attribute indicating that the node is locked. If the node has an incoming degree of at least one, is used, and has a routing attribute indicating that the node is locked, the empty site can be added to the list.

In another embodiment, determining whether each of the plurality of empty sites of the target device has a routing conflict can include, for each of the plurality of empty sites, selecting a pin of the empty site and performing a depth-first search of a DAG representing routing information with respect to the selected pin. The depth-first search can be performed until either a node having an incoming degree of at least one, which is used, is identified or a node having an incoming degree of two or more, which is not used, is identified.

If a node having an incoming degree of at least one, which is used, is identified for a selected pin of an empty site, the method can include determining whether the identified node is locked. The empty site can be added to the list only if the depth-first search of the selected pin identifies a node that has an incoming degree of at least one, is used, and is locked.

Another embodiment of the present invention can include a computer-implemented method of implementing a circuit design in a target device including representing routing information for a circuit design that has been at least partially implemented as a DAG and identifying empty sites of the target device. For each empty site, the method can include traversing a path in the DAG starting from at least one pin of the empty site and determining whether a node within the path, having an incoming degree of at least one, is used and is associated with a routing attribute indicating that the node is locked. If so, a determination can be made that the empty site has a routing conflict and the empty site can be added to a list of empty sites to be excluded during placement. The list of empty sites can be output, for example, by storing the list in a memory, passing the list to subsequent implementation software, providing the list to a user, and so forth.

The method also can include generating and storing a list specifying each empty site of the target device that has a routing conflict. At least a portion of the circuit design can be placed on the target device such that each empty site specified on the list of empty sites is not assigned a circuit element of the circuit design.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to the placement of circuit designs in the context of iterative implementation flows. The available area of an integrated circuit (IC) often limits the number of programmable interconnect points (PIPs) that can be included on an IC. This limits the connectivity available on the IC, as there are not enough PIPs to allow each wire to connect to each other wire. As a result, some wires serve as the only signal path into, or out of, a selected logic cell of the target programmable logic device (PLD). When such a wire is used for a different logic cell, that wire is unavailable for use with the selected logic cell. This can lead to a routing conflict in which the selected logic cell becomes unusable since there may be no other wires available to route signals to and/or from the selected logic cell.

After subjecting a circuit design to one or more implementation flows, or phases of an implementation flow, the circuit design can be said to be implemented, or at least partially implemented. Routing information generated by an implementation flow, or a phase of an implementation flow, can be analyzed to identify empty sites, e.g., logic cells, of the target device that are associated with routing conflicts. If, for example, after a user-specified change to the circuit design is made, a circuit element of the circuit design is placed at an empty site that has a routing conflict, an infeasible circuit design will result since the wire(s) needed for routing signals to that logic cell are unavailable.

In accordance with the embodiments disclosed herein, logic cells, or available sites of the target PLD, that have routing conflicts can be identified. These sites can be made available to a placer or placement algorithm of an Electronic Design Automation (EDA) tool. The circuit design, a modified version of the circuit design, or any portion thereof, can be placed by the EDA tool such that circuit elements are not placed at any sites of the target PLD that have been identified as having a routing conflict.

Figure 1:
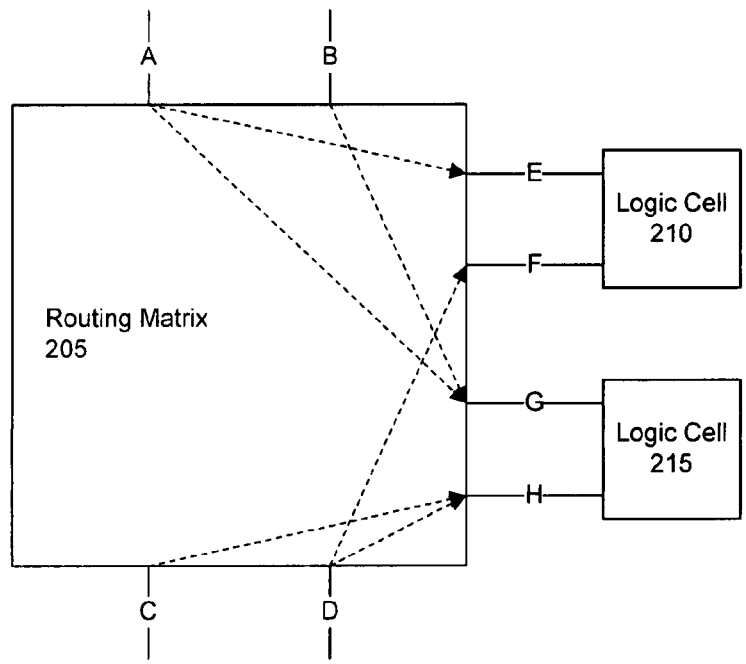
FIG. 1 is a block diagram illustrating a portion of a programmable logic device (PLD) which is useful for understanding the embodiments disclosed herein.

FIG. 1 is a block diagram illustrating a portion of a PLD which is useful for understanding the embodiments disclosed herein. As shown, FIG. 1 depicts a routing matrix 205 and two logic cells 210 and 215. As used herein, a logic cell can refer to a portion of a configurable logic block (CLB) referred to as a "slice", for example. Slices and CLBs are commonly found within field programmable gate array (FPGA) type PLDs commercially available from Xilinx, Inc. of San Jose, Calif.

For purposes of illustration, logic cells 210 and 215 can be said to be within a same CLB. Typically, a CLB includes a set number of slices, such as 2, 4, or the like. The number of slices included within a CLB can vary according to the architecture of the particular PLD being referenced or used. As such, the embodiments disclosed herein are not intended to be limited to devices having CLBs with any particular number of slices or logic cells. Moreover, it should be appreciated that a "logic cell", or site, can refer to another type of functional block that is available on any of a variety of PLDs and which can be programmed to implement one or more functions. For example, a logic cell can refer to a site of a PLD that can receive, or be placed with, a circuit element of a circuit design.

A plurality of physical wires A, B, C, D, E, F, G, and H of the target PLD are also shown. Each logic cell 210 and 215 is linked to the routing matrix 205 via two wires. Logic cell 210, for example, is linked with the routing matrix 205 via wires E and F. Logic cell 215 is linked with the routing matrix 205 via wires G and H. In order for a logic cell to be functional, each wire linking that logic cell to the routing matrix 205, e.g., each of wires E and F for logic cell 210 or each of wires G and H for logic cell 215, must connect to another wire, e.g., wire A, B, C, or D.

As noted, the area constraints of modern ICs prevent the number of PIPs needed for each wire to connect to each other wire from being implemented within the routing matrix 205. With respect to FIGS. 1 and 2, PIPs have been depicted as dashed lines connecting the various wires leading into or out from the routing matrix 205. In illustration, wire A can link only to wires E or G. In an exemplary embodiment, when wire A is connected via a PIP to wire E, wire A cannot be connected to wire G. Wire B can link only to wire G. Wire C can link only to wire H. Wire D can link only to wire F or H.

While signal paths on a particular PLD can be described in terms of wires, PIPs, and routing matrices, routing also can be described, or represented, as a directed acyclic graph (DAG). In a DAG, each node can represent a wire and each arc linking two nodes can represent a PIP. Current flow is represented by the direction of the arcs. The DAG can be traversed or searched, for example, using a Depth-first Search (DFS) or other suitable algorithm. Accordingly, it should be appreciated that in terms of searching or traversing the routing of a PLD, the mention of a wire is tantamount to a node and the mention of an arc is tantamount to a PIP.

In reviewing the potential connections for wire H (node H of the DAG), a depth-first search of the DAG can be performed from the perspective of the pin of logic cell 215 that is connected to wire H. Accordingly, leaving logic cell 215 and traversing node H, a junction or potential branch is encountered in the routing matrix 205. This can be represented in the DAG as two arcs entering node H. While logic cell 215 is in an empty state, node H can be said to be empty, or unused. Node H further can be said to have an incoming degree of two in that two arcs (PIPs) flow into node H. One arc represents the PIP that can connect wire H to wire C, and the other arc represents the PIP that can connect wire H to wire D. A wire having an incoming degree of "n" indicates that "n" different arcs, via "n" available PIPs in the target device, lead to the subject wire or node.

Figure 2:
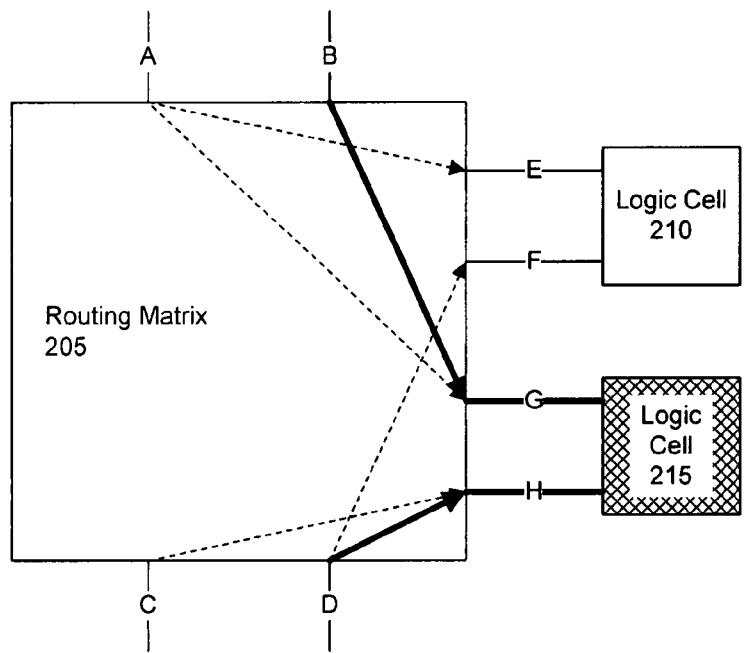
FIG. 2 is a block diagram illustrating the portion of the PLD shown in FIG. 1 after a circuit design has been at least partially implemented on the PLD.

FIG. 2 is a block diagram illustrating the portion of the PLD shown in FIG. 1 after a circuit design has been at least partially implemented on the PLD. As noted, the circuit design has undergone an implementation flow such that one or more components of the circuit design have been assigned or placed on the target PLD. Further, the circuit design can be routed, or at least partially routed. FIG. 2 reflects this stage of development of the circuit design. For example, the cross-hatching on logic cell 215 indicates that the site is occupied by one or more circuit elements of the circuit design. As logic cell 215 is occupied, or "not empty", wire B has been connected to wire G through a PIP in the routing matrix 205. Similarly, wire D has been connected to wire H through a PIP in the routing matrix 205. Thus, wire B and wire D have been used for logic cell 215. Logic cell 210, however, remains available to receive, or be programmed to implement, one or more circuit elements. In this regard, logic cell 210 can be said to be "empty" or be referred to as an "empty site".

If circuit elements were to be placed at logic cell 210, it can be seen that wire E can be connected to wire A via the routing matrix 205. The only connection available for wire F, however, is wire D. Since wire D has already been used to connect with wire H for logic cell 215, wire D is unavailable (used). Within a DAG describing this situation, node F, corresponding to wire F, will have an input degree of one. In this case, however, the only node to which node F can connect, i.e., node D, is already used. This creates a routing conflict with respect to logic cell 210, and more particularly, a blockage with respect to wire F and the pin of logic cell 210 to which wire F is connected. Simply stated, with the configuration shown in FIG. 2, a circuit design having a circuit element placed at logic cell 210 will be infeasible. There is no way to route signals to and/or from logic cell 210 via wire F. Conventional placers do not account for such limitations.

In accordance with the embodiments disclosed herein, empty sites such as logic cell 210 can be identified and added to a list. This list, specifying empty sites having blockages, can be provided to a placer. The placer can be configured so that no circuit components, or elements, are placed at any empty site that is specified on the list.

In another embodiment, a wire such as wire D may have an attribute indicating that the wire is not locked. That is, routing for the circuit design that involves wire D may be re-routed in a subsequent implementation flow or phase of a subsequent implementation flow. If that is the case, logic cell 210 may not be added to the list of sites to be excluded from use during placement, as re-routing one or more portions of the circuit design may result in a routing that does allow both logic cell 210 and 215 to be used, e.g., a feasible routing. The pin of logic cell 210 connected to wire F is not considered to have a blockage in that case. Similarly, the logic cell 210 is not considered to have a routing conflict.

If, however, wire D is associated with a routing attribute indicating that the wire is "locked", logic cell 210 will be added to the list of sites to be excluded from use during placement. The pin of logic cell 210 connected to wire F is considered to have a blockage and logic cell 210 is considered to have a routing conflict. Such is the case in the pictured embodiment, as wire D is the only wire that can connect to wire F. Wire D, however, is locked with respect to routing and its use for logic cell 215.

Figure 3:
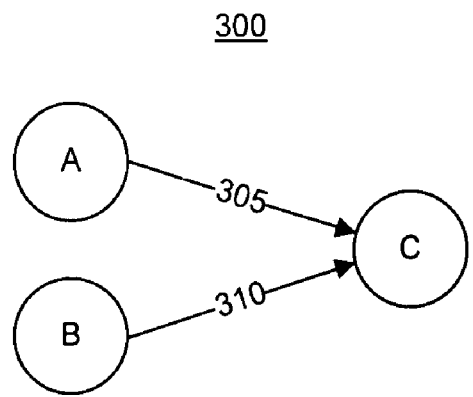
FIG. 3 is a portion of a first directed acyclic graph (DAG) which is useful for understanding various aspects of the present invention.

FIG. 3 is a portion of a DAG 300 which is useful for understanding various aspects of the present invention. FIG. 3 illustrates an example of a stopping condition that can be utilized in a DFS of a DAG. More particularly, FIG. 3 illustrates a case in which an EDA tool can determine that a particular pin is not blocked, e.g., does not have, or is not associated with, a blockage. As shown, wires A, B, and C have been represented by nodes A, B, and C respectively. Wire A can be connected to wire C via a PIP represented by arc 305. Wire B can be connected to wire C via a PIP represented by arc 310. Nodes A, B, and C can be unused.

The DAG 300 can be traversed from right-to-left beginning at node C. Node C, due to arcs 305 and 310, can be said to have an incoming degree of two. When a node, in this case node C, is encountered that has an incoming degree of two or more, which is not used, a DFS being conducted for a pin, for example, a pin connected to node C, can be stopped. The pin is not considered to have a routing blockage.

Figure 4:
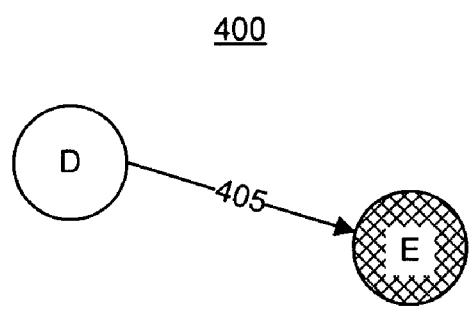
FIG. 4 is a portion of a second DAG which is useful for understanding various aspects of the present invention.

FIG. 4 is a portion of a DAG 400 which is useful for understanding various aspects of the present invention. FIG. 4 illustrates an example of another stopping condition that can be utilized in a DFS of a DAG. More particularly, FIG. 4 illustrates the case in which an EDA tool determines that a pin has a blockage. As shown, wires D and E are represented by nodes D and E respectively. Node E is used, as indicated by the cross-hatching applied thereto. Arc 405 allows node D to be connected with node E.

The DAG 400 can be traversed from right-to-left beginning at node E. Node E can be said to have an incoming degree of one. When a node, such as node E, is encountered, e.g., traversed, that has an incoming degree of one or more, but is used, a DFS being conducted for a pin, such as one connected to node E, can be stopped. The pin is considered to be blocked or have a routing blockage. As noted, however, if node E is associated with a routing attribute indicating that node E is not locked, then node E, or a pin connected to node E is not considered to have a blockage.

Figure 5:
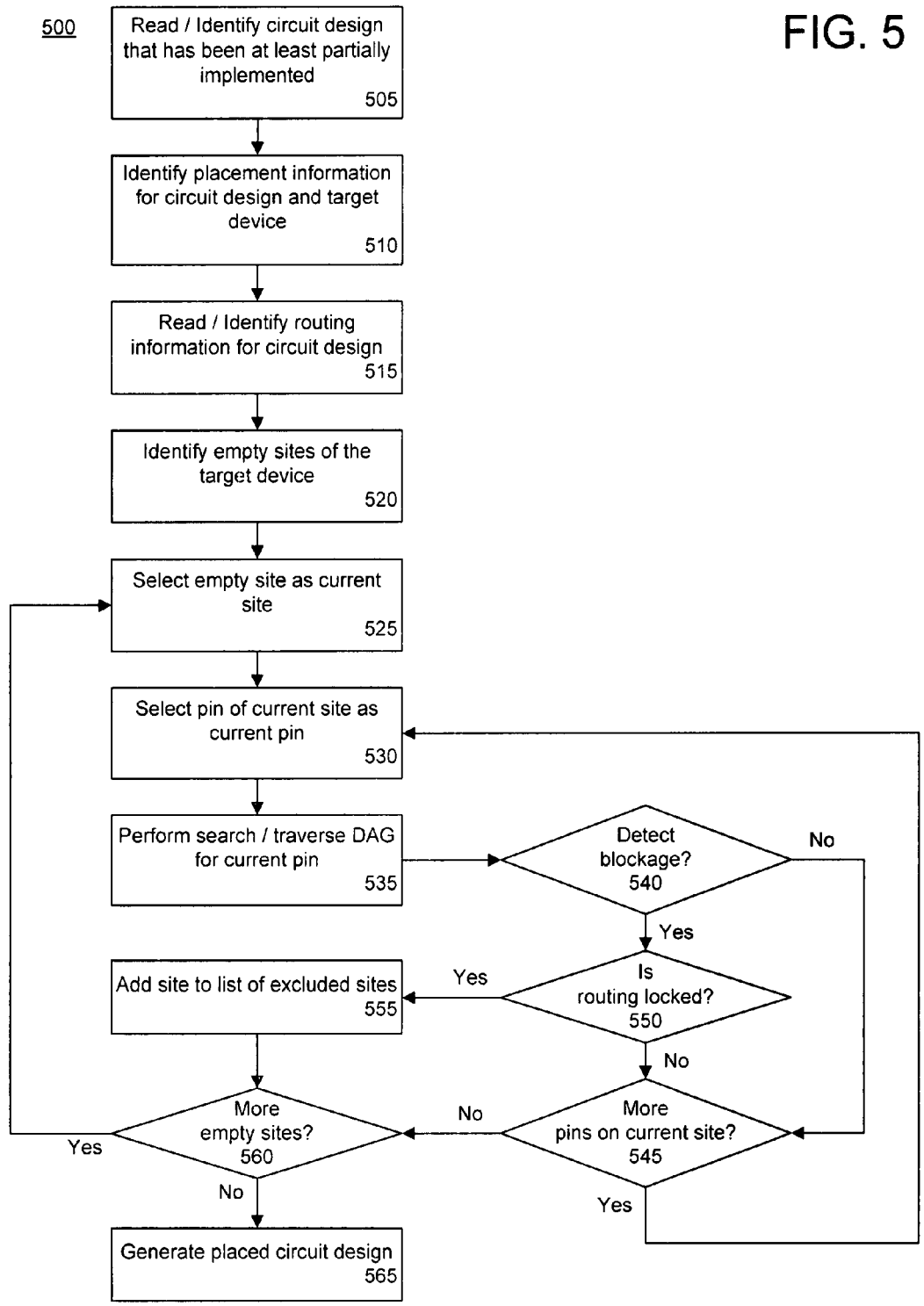
FIG. 5 is a flow chart illustrating a method of identifying available sites for placement of a circuit design within an iterative implementation flow in accordance with another embodiment of the present invention.

FIG. 5 is a flow chart illustrating a method 500 of identifying available sites for placement of a circuit design within an iterative implementation flow in accordance with another embodiment of the present invention. The method 500 can begin in a state in which a circuit design has undergone an implementation flow, or at least part of an implementation flow such that one or more circuit elements have been placed and routed with respect to a given target PLD. Further, a change to the implementation or partial implementation of the circuit design may have been specified resulting in the need for a further implementation flow or phase of an implementation flow, e.g., placement, to be applied to the modified circuit design.

In step 505, the circuit design that has been at least partially implemented can be read into an EDA tool or otherwise identified to the EDA tool. In step 510, placement information that exists for the circuit design for the target device can be read and/or identified by the EDA tool. In step 515, routing information that exists for the circuit design for the target device can be read and/or identified by the EDA tool. It should be appreciated that the routing information specifies the particular wires and paths of connecting wires that are used to transmit signals among the circuit elements that have been placed on sites of the target device. As noted, the routing information for the circuit design can be placed into a DAG format as described herein, which further represents the available routing architecture of the target PLD. In step 520, any sites of the target device that are empty can be identified. As noted, an empty site of the target device refers to a logic cell that has not been assigned, or placed with, a circuit element of the circuit design.

In step 525, an empty site can be selected as the current site. In step 530, a pin of the current site can be selected as the current pin. In step 535, a search can be performed for the pin that traverses the DAG starting at the current pin on the target device to identify any pins (and sites) having a routing conflict. The DAG can be traversed in a direction that is opposite the flow of the graph and which moves away from the current pin until a stopping condition is encountered. As noted, in one embodiment, the search technique applied to each pin can be a depth-first-search.

To better illustrate the searching that can be performed, assume that logic cells 210 and 215 of FIG. 1 are empty and that logic cell 215 is selected as the current site with the pin connected to wire H being selected as the current pin. In that case the search of the DAG beginning at the current pin would terminate at node H, representing wire H, since node H is not used and has an incoming degree of two. This situation indicates that the pin connected to wire H is not associated with a blockage. If the same situation is found to exist for node G, then the logic cell 215 can be used during placement.

Referring again to FIG. 1, where logic cells 210 and 215 are empty, assume that logic cell 210 is selected as the current site with the pin connected to wire E being selected as the current pin. In that case a search of the DAG beginning at the current pin would continue past routing matrix 205 since node E is empty and has an incoming degree of one. Though not blocked, a termination condition for the search, as described with reference to FIG. 3 or 4, has not been found.

Referring now to FIG. 2, where logic cell 215 is occupied, assume that logic cell 210 is empty and selected as the current site with the pin connected to wire F being selected as the current pin. In that case a search of the DAG starting at the current pin would terminate at node D since node D has an incoming degree of one or more and is not empty. The search determines that a blockage has been encountered since the only node that can link to node F is not empty. Accordingly, logic cell 210 can be added to the list of excluded sites, assuming that the routing attributes associated with node D indicate that wire D is locked.

Continuing with step 540, a determination can be made as to whether a blockage has been encountered or detected while traversing the DAG for the current pin. If so, the method can proceed to step 550. If not, the method can continue to step 545. In step 545, a determination can be made as to whether more pins remain to be searched for the current site or logic cell. If so, the method can loop back to step 530 to select another pin and continue processing. If no further pins remain to be processed for the current site, the method can continue to step 560.

Continuing with step 550, in the case where a blockage for the current pin, and current site, has been detected, a determination can be made as to whether routing is locked. For example, with respect to a given pin, the DAG can be traversed leading to a node, e.g., node X, that is used and which has an incoming degree of one or more. The routing attribute (s) associated with the node X can be analyzed to determine whether node X (corresponding to wire X) is locked. If the routing attribute(s) indicate that the node X is locked, the method can continue to step 555 where the current site is added to the list of excluded sites. The current site is added to the list since existing portions of the circuit design cannot be re-routed to produce a feasible routing for the circuit design should a circuit element be placed at the current site.

If, however, the attributes associated with node X indicate that node X is not locked, the current site is not added to the list of excluded sites. Since the existing routing for the circuit design, at least with respect to node X, can be "ripped-up" or re-routed in subsequent stages of the iterative implementation flow, the current site is not considered to have a blockage.

Such is the case as a feasible routing may be determined by re-routing previously routed portions of the circuit design. In that case, the method can continue to step 545 to continue processing further pins. The current site is not added to the list of excluded sites. Such is the case as the EDA tool assumes that the blockage will be removed by the routing component (router) of the EDA tool during a subsequent stage of implementation.

In step 560, a determination can be made as to whether more empty sites of the target device remain to be processed. If so, the method can loop back to step 525. If not, the method can continue to step 565 where the circuit design can be placed. The EDA tool, or placement component (placer) of the EDA tool, can generate a feasible "placed" circuit design that is free of routing conflicts by not assigning circuit elements of the circuit design to any sites that are specified on the list of sites to be excluded. The placed circuit design can be stored or processed further.

For example, once the list of excluded sites is generated, the list can be provided or used by a placer. The placer can continue to process the circuit design by placing circuit elements to sites on the target device as may be required or necessary according to the particular type of iterative implementation flow being performed. The placer assigns circuit elements only to allowable empty sites. That is, the placer will not place any circuit elements in empty sites specified on the list of excluded sites as placing a circuit element at such a site would result in an infeasible circuit implementation.

It should be appreciated that once the list of excluded sites is generated, a placer can be modified to prevent excluded sites from being considered in a variety of different ways. For example, in one embodiment, the list of excluded sites can be compared to a list of allowable sites for use by the placer. The list of allowable sites can be purged of any sites listed on the list of excluded sites. The placer then places circuit elements only at "allowed" sites. In another embodiment, once a site is selected for placement by the placer, a check can be made as to whether the selected site is listed on the list of excluded sites. If so, the placer can select a different site for placing a circuit element. Such a check can be continually implemented each time a site of the target device is selected for placement.

After placement, further stages of implementation can be performed. For example, the circuit design can be routed. The router can re-route any signals as needed including those associated with wires that were identified as having a blockage, but were unlocked. Further optimizations to the circuit design can be performed by the EDA tool if so desired.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

The present invention also can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program", "software", "application", "computer-usable program code", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e., open language. The term "coupled", as used herein, is defined as connected, although not necessarily directly, and not necessarily mechanically, e.g., communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A computer-implemented method of implementing a circuit design in a target device, the method comprising:
   executing a program by a computer system to perform functions including:
      identifying routing information for a circuit design that has been at least partially implemented;
      identifying a plurality of empty sites of the target device within which the circuit design is to be implemented;
      determining whether each of the plurality of empty sites of the target device has a routing conflict according to the routing information of the circuit design;
      wherein determining whether each of the plurality of empty sites of the target device has a routing conflict further includes determining whether at least one pin of each of the plurality of empty sites has a blockage;

determining that a pin does not have a blockage when, while traversing a directed acyclic graph representing routing information with respect to the pin, a node is identified that is not used and has an incoming degree of at least two;

generating a list specifying each of the plurality of empty sites of the target device that has a routing conflict; and outputting the generated list.

2. The method of claim 1, further comprising generating a placed circuit design such that no circuit element of the circuit design is assigned to an empty site on the list of empty sites.

3. The method of claim 1, wherein determining whether each of the plurality of empty sites of the target device has a routing conflict comprises, for each of the plurality of empty sites:

selecting a pin of an empty site;

while traversing the directed acyclic graph representing routing information with respect to the selected pin, determining whether a node having an incoming degree of at least one is used; and when the node is used, determining whether the node is associated with a routing attribute indicating that the node is locked.

4. The method of claim 3, further comprising, when the node having an incoming degree of at least one is used and has a routing attribute indicating that the node is locked, adding the empty site to the list.

5. The method of claim 1, wherein determining whether each of the plurality of empty sites of the target device has a routing conflict further comprises, for each of the plurality of empty sites:

selecting a pin of the empty site; and performing a depth-first search of the directed acyclic graph representing routing information with respect to the selected pin until either, a node having an incoming degree of at least one, which is used, is identified; or a node having an incoming degree of at least two, which is not used, is identified.

6. The method of claim 5, further comprising, when the node having an incoming degree of at least one, which is used, is identified for a selected pin of an empty site, determining whether the identified node is locked.

7. The method of claim 6, further comprising adding the empty site to the list only when the depth-first search of the selected pin identifies the node that has an incoming degree of at least one, which is used and locked.

8. A computer-implemented method of implementing a circuit design in a target device, the method comprising:

executing a program by a computer system to perform functions including:

representing routing information for a circuit design that has been at least partially implemented as a directed acyclic graph (DAG);

identifying empty sites of the target device;

for each empty site, traversing a path in the DAG starting from at least one pin of the empty site and determining whether a node within the path, having an incoming degree of at least one, is used and is associated with a routing attribute indicating that the node is locked;

when the path is used and is associated with the routing attribute indicating that the node is locked, determining that the empty site has a routing conflict and adding the empty site to a list of empty sites to be excluded during placement; and outputting the list of empty sites.

9. The method of claim 8, further comprising generating a list specifying each empty site of the target device that has a routing conflict.

10. The method of claim 9, further comprising placing at least a portion of the circuit design on the target device such that each empty site specified on the list of empty sites is not assigned a circuit element of the circuit design.

11. A computer program product, comprising:

a computer-usable storage device having computer-usable program code that implements a circuit design in a target device, the program code that when executed by a processor causing the processor to perform operations including:

identifying routing information for a circuit design that has been at least partially implemented;

identifying a plurality of empty sites of a target device within which the circuit design is to be implemented;

determining whether each of the plurality of empty sites of the target device has a routing conflict according to the routing information of the circuit design;

wherein the determining whether each of the plurality of empty sites of the target device has a routing conflict includes determining whether at least one pin of each of the plurality of empty sites has a blockage;

determining that a pin does not have a blockage when, while traversing a directed acyclic graph representing routing information with respect to the pin, a node having an incoming degree of at least two, which is not used, is identified;

and generating and storing a list specifying each of the plurality of empty sites of the target device that has a routing conflict.

12. The computer program product of claim 11, wherein the program code when executed by the processor further causes the processor to perform operations of generating and outputting a placed circuit design wherein no circuit element of the circuit design is assigned to an empty site on the list of empty sites.

13. The computer program product of claim 11, wherein the operation of determining whether each of the plurality of empty sites of the target device has a routing conflict comprises, for each of the plurality of empty sites:

selecting a pin of an empty site;

determining, while traversing the directed acyclic graph representing routing information with respect to the selected pin, whether a node, having an incoming degree of at least one, is used; and determining whether a node is associated with a routing attribute indicating that the node is locked when the node is determined to have an incoming degree of at least one and is used.

14. The computer program product of claim 13, wherein the program code when executed by the processor further causes the processor to perform an operation of adding the empty site to the list when the node has an incoming degree of at least one, is used, and has a routing attribute indicating that the node is locked.

15. The computer program product of claim 11, wherein the operation of determining whether each of the plurality of empty sites of the target device has a routing conflict comprises, for each of the plurality of empty sites:

selecting a pin of the empty site; and performing a depth-first search of the directed acyclic graph representing routing information with respect to the selected pin until either, a node having an incoming degree of at least one, which is used, is identified; or a node having an incoming degree of at least two, which is not used, is identified.

16. The computer program product of claim 15, wherein the program code when executed by the processor further causes the processor to perform the operations comprising:

computer-usable program code that, when the node having an incoming degree of at least one, which is used, is identified for a selected pin of an empty site, determines whether the identified node is locked; and computer-usable program code that adds the empty site to the list only when the depth-first search of the selected pin identifies the node that has an incoming degree of at least one, which is used and locked.

* * * * *